(12) United States Patent
Robbins

(10) Patent No.: US 9,000,615 B2
(45) Date of Patent: Apr. 7, 2015

(54) SOLAR POWER MODULE WITH SAFETY FEATURES AND RELATED METHOD OF OPERATION

(75) Inventor: Steven Andrew Robbins, Calabasas, CA (US)

(73) Assignee: Sunfield Semiconductor Inc., Calabasas, CA (US)

(*) Notice: Subject to any disclaimer, the term of this patent is extended or adjusted under 35 U.S.C. 154(b) by 551 days.

(21) Appl. No.: 13/366,286

(22) Filed: Feb. 4, 2012

(65) Prior Publication Data

US 2013/0200710 A1  Aug. 8, 2013

(51) Int. Cl.
*H02J 1/06* (2006.01)
*H01L 31/02* (2006.01)

(52) U.S. Cl.
CPC .. *H02J 1/06* (2013.01); *Y02E 10/50* (2013.01); *H01L 31/02021* (2013.01)

(58) Field of Classification Search
CPC .......................................................... H02J 1/06
USPC .......................................................... 307/77
See application file for complete search history.

(56) References Cited

U.S. PATENT DOCUMENTS

| | | | |
|---|---|---|---|
| 2012/0044014 A1* | 2/2012 | Stratakos et al. | 327/530 |
| 2012/0194003 A1* | 8/2012 | Schmidt et al. | 307/116 |

* cited by examiner

*Primary Examiner* — Rexford Barnie
*Assistant Examiner* — Toan Vu

(57) ABSTRACT

A solar power module, and related method of operation, that protects the bypass diodes in the solar power module from overheating due to partial shading, and also protects firefighters and installer personnel from electrical shock hazard. The solar power module includes active bypass switches, and isolation switches that disconnect the PV cells from the bypass switches when all the bypass switches are closed concurrently, thereby allowing the PV cells to continue supplying power to the control circuitry. The isolation switches are also used to maintain the solar power module in a safe state during installation, or in case of fire.

18 Claims, 6 Drawing Sheets

SOLAR POWER MODULE WITH SAFETY FEATURES AND RELATED METHOD OF OPERATION

BACKGROUND

The invention relates generally to the field of photovoltaic (PV) solar power systems, and more specifically to circuits and methods for protecting bypass diodes from overheating under partial shading conditions, and protecting human personnel from shock hazards.

FIG. 1 is a high level block diagram of a conventional solar power system 10 including a plurality of subunits 11 connected in series. Each subunit 11 includes: a first terminal 14 and a second terminal 15 for serial connection with other subunits 11; a bypass diode 13; and a PV segment 12 comprising a plurality of PV cells wired in series. The subunits feed power to an inverter 16 which produces an ac voltage output 17 that is typically tied to the ac electrical power grid.

The PV segments 12 in a solar power system, such as 10, are typically well matched in their characteristics, so when all the segments are equally illuminated by sunlight, they produce nearly equal amounts of energy. However, occasionally one PV segment will be partially shaded by some obstruction—such as a tree branch or chimney—and consequently, the energy produced by the shaded segment is reduced. In this situation, the unshaded segments can force the shaded segment into reverse breakdown, wherein the PV cells generate excessive heat, and may be damaged. The bypass diode 13 protects the shaded PV segment 12 from reverse breakdown by allowing the excess current to flow around the PV segment, rather than through it.

A potential problem in PV systems, such as 10, is overheating in one or more of the bypass diodes 13. For example, assume the string current ($I_{STRING}$) is 11 Amps, but the short-circuit output current of one of the PV segments 12 is only 1 Amp, due to shading. This means the current in the associated bypass diode 13 is 10 Amps. If the forward voltage drop of the bypass diode 13 is 0.5V, then the heat dissipation in the bypass diode is 5 W. A typical solar junction box affixed to the back side of a solar power module contains three bypass diodes, so in this example the total power dissipation in such a junction box could be as high as 15 W if all three PV segments are shaded. Furthermore, ambient temperatures around a solar junction box can easily exceed 70 C. Give all these factors, the junction temperature of a bypass diode 13 can exceed 200 C. When the shade is removed, the short-circuit output current of the PV segment 12 increases, and the associated bypass diode 13 becomes reverse biased. However, because the diode junction is still very hot, the reverse leakage current may be excessive, particularly if the diode is a Schottky. For example, if the reverse leakage is 200 mA, and the output voltage of the PV segment 12 is 12V, then the diode 13 dissipates 2.4 W. But leakage current approximately doubles for every 10 C. rise in junction temperature, so as the diode 13 becomes hotter, the leakage increases, which heats the diode even more. This positive feedback mechanism—known as thermal runaway—can easily destroy the diode 13, typically making it a short circuit.

One solution well known to those of ordinary skill in the art, is to use an active bypass circuit. This approach is becoming increasingly popular, with several products already on the market at the time of this writing. Examples of such are the LX2400 from Microsemi Corp. of Garden Grove, Calif. (US), and the SPV1001T40 from STMicroelectronics of Agrate Brianza (MI) (IT).

FIG. 2 shows a high level block diagram of a subunit 20 including a typical active bypass circuit comprising a bypass switch 21 and a local controller circuit 22. The local controller 22 includes positive 23 and negative 24 inputs for sensing the polarity of the voltage across the bypass diode 13. When the PV segment 12 is partially shaded, the bypass 13 diode becomes forward biased. The local controller 22 sees a positive voltage across its differential inputs 23 and 24, and responds by closing the bypass switch 21. The voltage drop across the closed bypass switch 21 is much lower than the voltage drop across the diode 13 before the switch was closed. Accordingly, the heat dissipation is greatly reduced. When full sunlight is restored to the PV segment 12, current in the bypass switch 21 reverses. The local controller 22 sees a negative voltage between 23 and 24, and responds by opening the bypass switch 21.

One problem with the prior art circuit 20 is that the local controller 22 needs a voltage supply to operate. The bypass switch 21 is typically a power MOSFET that requires at least 5V applied between its gate and source terminals to fully turn on. As such, the local controller 22 needs a supply voltage of at least 5V. The PV segment 12 typically provides 12V in full sunlight, but when the bypass switch 21 is closed, the outputs of the PV segment 14 and 15, are essentially shorted together so the PV segment 12 cannot provide the voltage needed to power the local control circuit 22.

The bypass switch 21 does not have zero resistance, so when current flows through the switch 21, a small voltage—typically 50 mV—develops between the terminals 14 and 15. Various examples of prior art have sought to utilize this small voltage to create a supply voltage of 5V or more. For example, U.S. Patent Application Pub. No. 2011/0006232 A1 discloses a self-powered active bypass circuit wherein a system of charge pumps and oscillators amplifies the voltage, and U.S. Patent Application Pub. No. 2011/0242865 A1 (the '865 application) discloses a self-powered active bypass circuit utilizing resonance for amplification. But each of these prior art examples controls only a single bypass switch, while a typical PV solar power module requires three or more such bypass switches. Furthermore, these examples of prior art are relatively expensive; for example, the '865 application requires a relatively expensive transformer for each bypass circuit.

Another problem with the conventional system 10 is safety for installer personnel and firefighters. An interrupter switch 18 is typically used to shut down the system 10, but such a switch 18 merely shuts off the flow of current ($I_{STRING}$) into the inverter 16. The problem is that the array continues to produce a high voltage ($V_{STRING}$) that can be several hundred volts, posing a shock hazard to anyone who connects or disconnects the cables.

Therefore, there is a need in the solar power industry for a solar power module that protects the bypass diodes from overheating at low cost, and reduces the risk of shock for installers and firefighters.

SUMMARY

The solar power module and related method of operation disclosed herein has the ability to protect the bypass diodes from overheating, and protect firefighters and installer personnel from shock hazards.

The solar power module includes bypass diodes that protect the PV cells from reverse breakdown under partial shading conditions, and bypass switches that protect the bypass diodes from overheating. A novel aspect of the solar power module is the way that the control circuits for these switches are powered; when all the bypass switches are closed concurrently, isolation switches disconnect the PV cells from the chain of bypass switches, thereby enabling the PV cells to continue supplying voltage to the control circuits. After a delay, the isolation switches are closed again to allow the bypass switches the opportunity to open. If at least one bypass switch opens, due to the associated PV segment no longer being shaded, then all the isolation switches remain closed. Otherwise, the isolation switches open again, and the cycle repeats.

Another novel aspect of the solar power module is the ability to maintain a safe state. By closing all the bypass switches, the output voltage of the solar power module is reduced to nearly zero, thereby making it safe for installer personnel to connect the solar power module to an array, or firefighters to disconnect the solar power module from the array. By opening all the isolation switches, the PV cells can provide uninterrupted power to the control circuits, thereby enabling the solar power module to maintain the safe state. Some embodiments include a communication interface that can receive commands; the solar power module transitions to the safe state in response to a shut-down command, and transitions back to the operating state in response to a start-up command.

Other features and advantages of the solar power module and associated method of operation disclosed herein will become apparent from the following more detailed description, when taken in conjunction with the accompanying drawings, which illustrate, by way of example, the principles of the invention.

BRIEF DESCRIPTION OF THE DRAWINGS

The accompanying drawings illustrate the invention. In such drawings.

DETAILED DESCRIPTION

Figure 8:
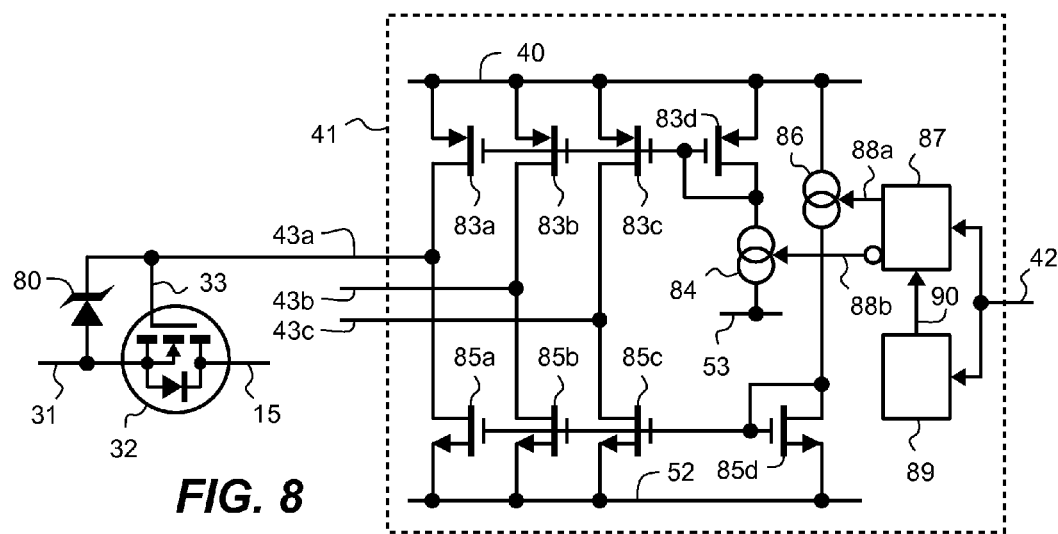
FIG. 8 is a simplified schematic diagram showing details of one embodiment of the main controller.
Figure 9:
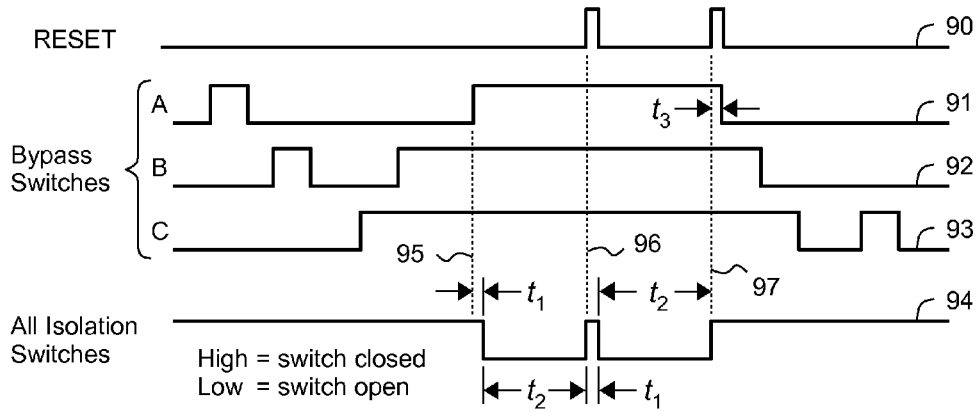
FIG. 9 is a timing diagram that illustrates the operation of the solar power module disclosed herein.
Figure 10:
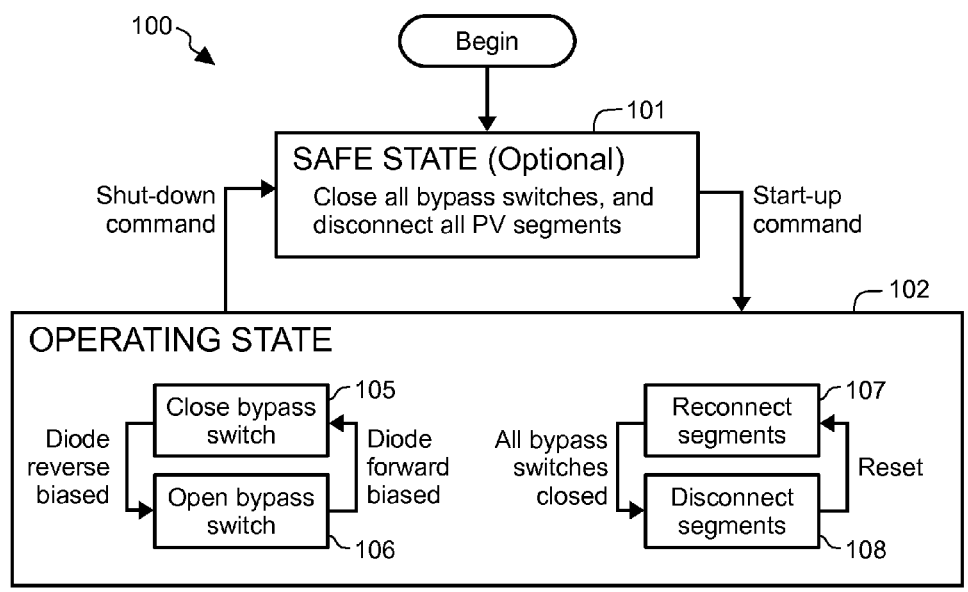
FIG. 10 is a high level diagram illustrating the method of operation for the solar power module disclosed herein.

As shown in the drawings for purposes of illustration, the present invention of a solar power module with safety features is shown with respect to FIGS. 3-9 and the related method of operation is shown generally with respect to FIG. 10.

Figure 1:
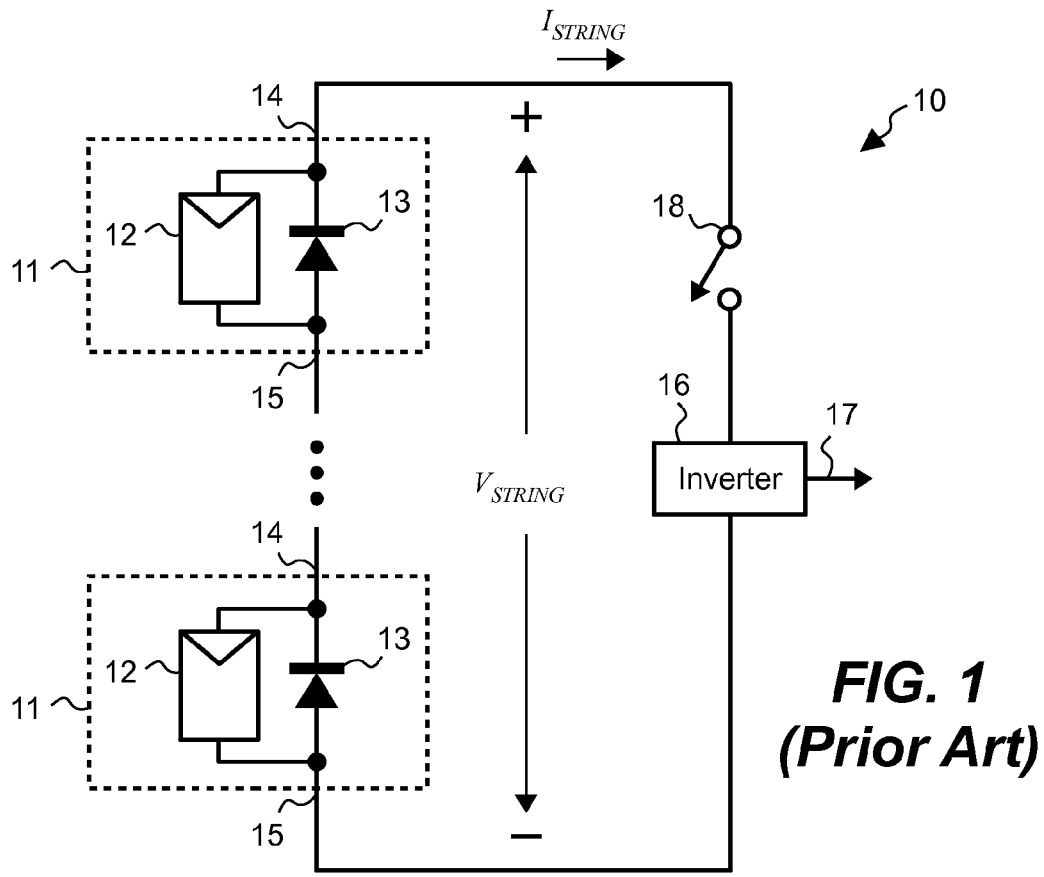
FIG. 1 is a high level block diagram of a conventional photovoltaic solar power system.
Figure 2:
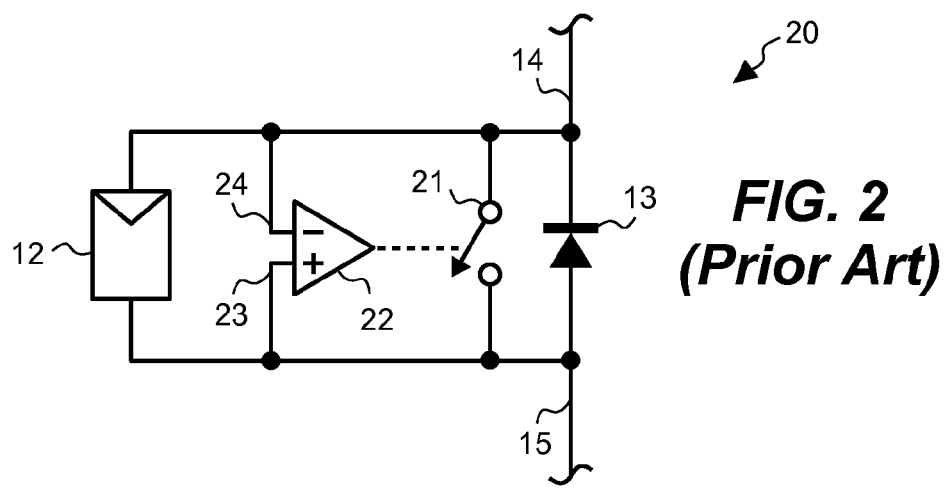
FIG. 2 is a high level block diagram showing a subunit of a solar power array with a conventional active bypass circuit.
Figure 3A:
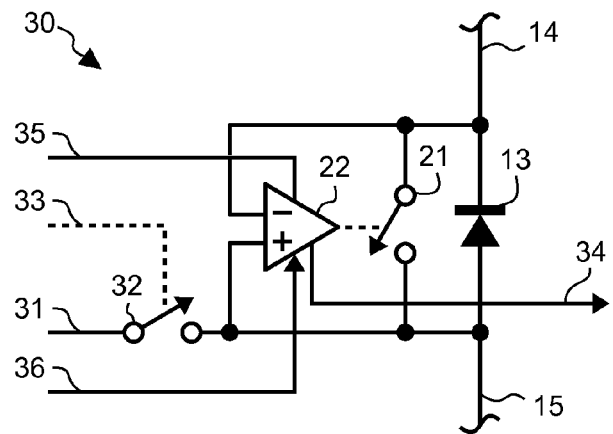
FIG. 3A is a high level block diagram showing a first embodiment of a smart bypass circuit.

FIG. 3A is a high level block diagram showing a first embodiment of a smart bypass circuit 30 used in the solar power module disclosed herein. The smart bypass circuit 30 shares some features with the prior art bypass circuit 20 in that, it includes: a first terminal 14 and a second terminal 15 for serial connection to other bypass circuits; a diode 13 disposed between the first 14 and second 15 terminals; a bypass switch 21 connected in parallel with the diode 13; and a local controller 22 that closes the bypass switch 21 when the diode 13 is forward biased, thereby opening the bypass switch 21 when the diode 13 is reverse biased. But the smart bypass circuit 30 is different from the prior art bypass circuit 20, at least in part, by the inclusion of several novel and advantageous features: a third terminal 31 for connection to a PV segment; an isolation switch 32 disposed between the second 15 and third 31 terminals for disconnecting and reconnecting the PV segment 12; and a status output signal 34 that indicates the on/off state of the bypass switch 21. The isolation switch 32 is controlled by an input signal 33 and the local controller 22 is powered by a supply voltage 35. Some embodiments also include a disable input 36 that closes the bypass switch 21 when asserted.

Figure 3B:
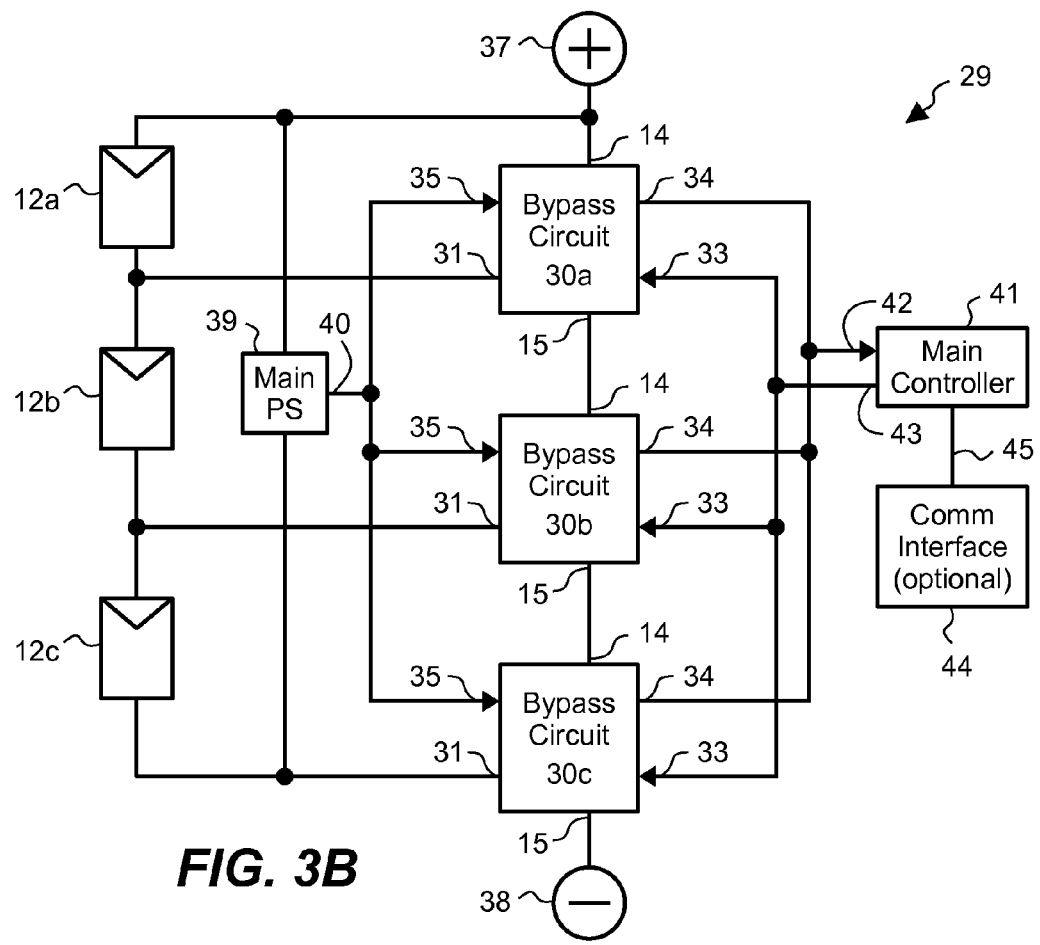
FIG. 3B is a high level block diagram showing a first embodiment of a solar power module including smart bypass circuits as shown in FIG. 3A.

FIG. 3B shows a high level block diagram of a first embodiment of the solar power module 29 disclosed herein. In this example, three smart bypass circuits 30a-30c are serially connected between a positive output terminal 37 and a negative output terminal 38. However, as would be obvious to anyone with ordinary skill in the art, any number of smart bypass circuits could be used; for example, some solar power modules may have five or six serially connected bypass circuits. Each smart bypass circuit is coupled to an associated PV segment via the third terminal 31; for example, bypass circuit 30a is coupled with PV segment 12a, and so forth. A main power supply 39 draws power from at least one of the PV segments 12a-12c and produces at least one output 40 that powers the smart bypass circuits 30a-30c. A main controller 41 has an input 42 for receiving the status output signals 34 from each smart bypass circuit 30a-30c. The main controller input 42 may be a single line, such as an open-drain bus, or a bus comprised of individual status signals 34 from each smart bypass circuit. The main controller 41 also has at least one output signal 43 for controlling the isolation switches 32 via the control input 33 in each smart bypass circuit 30a-30c.

In some embodiments the solar power module 29 also includes a communication interface 44 for communicating with another device such as an inverter 16, another solar power module, or a computer. The communication interface 44 is coupled to the main controller 41 via an interface 45. Many embodiments of the communication interface 44 will be obvious to one of ordinary skill in the art. In some embodiments the communication interface 44 is wireless and comprises a receiver or transceiver for communicating via electromagnetic fields or magnetic fields. In other embodiments the communication interface 44 utilizes power lines to convey information and comprises a power-line modem. In yet other embodiments the communication interface 44 utilizes a cable to convey information, such as coax or twisted-pair wiring, and comprises a means for electrical isolation such as an isolation transformer or optocoupler.

Figure 4A:
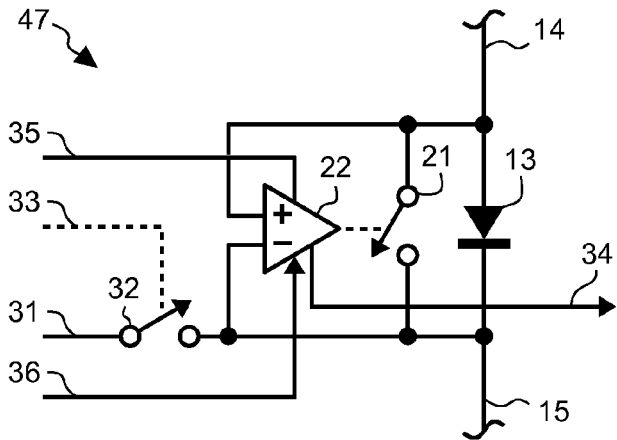
FIG. 4A is a high level block diagram showing a second embodiment of the smart bypass circuit.
Figure 4B:
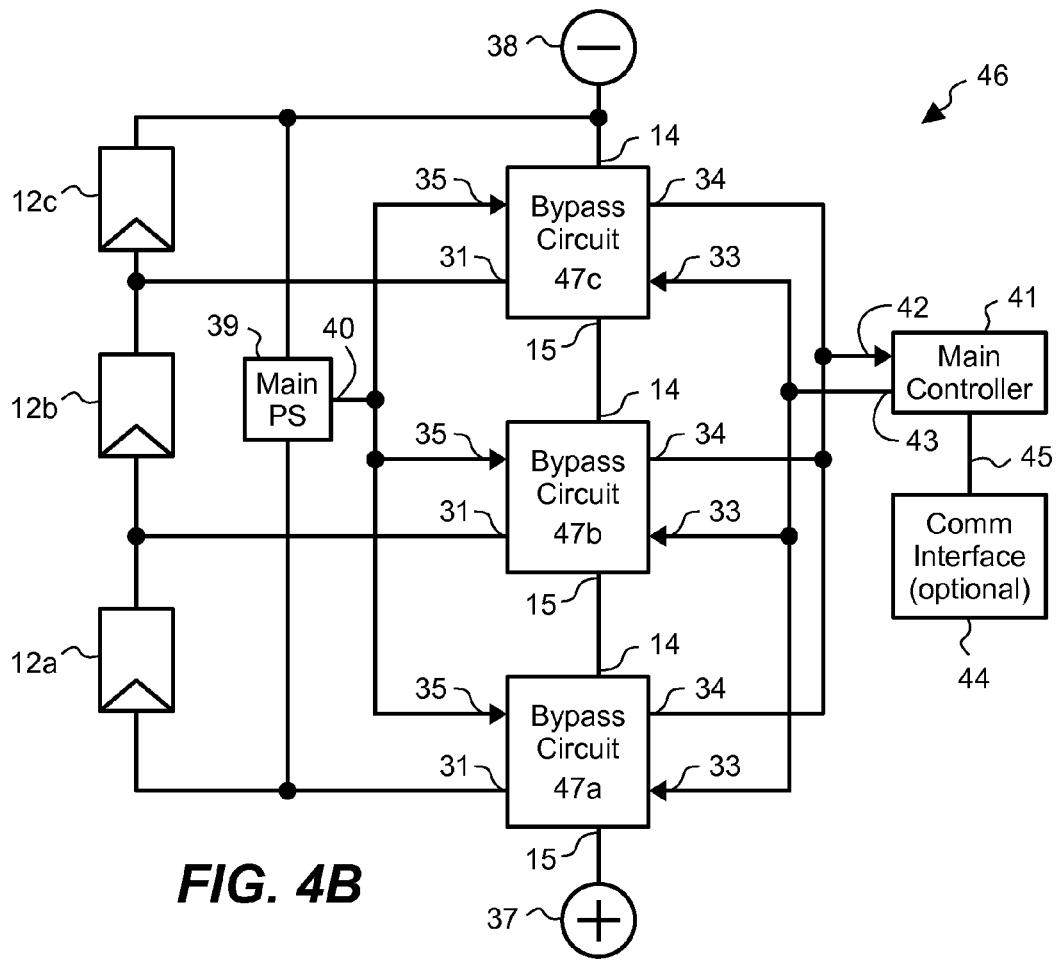
FIG. 4B is a high level block diagram showing a second embodiment of a solar power module including smart bypass circuits as shown in FIG. 4A.

FIGS. 4A-4B show high level block diagrams of a second embodiment of the bypass circuit 47 and a second embodiment of the solar power module 46, wherein the polarities are reversed with respect to FIGS. 3A-3B. The positive terminal 37 is at the bottom, the negative terminal 38 is at the top such that each PV segment 12a-12c and the diodes 13 are inverted.

The only difference between the first 30 and second 47 embodiments of the bypass circuit is the placement of the isolation switches 32. In FIG. 3A, the isolation switch 32 couples the anode of the diode 13 to the negative side of the associated PV segment 12, while in FIG. 4A the isolation switch couples the cathode of the diode 13 to the positive side of the associated PV segment 12.

For simplicity, the detailed descriptions that follow below refer to the first embodiment of the smart bypass circuit 30 and the first embodiment of the solar power module 29. However, it will be obvious to one of ordinary skill in the art how these detailed descriptions also relate to the second embodiments, 47 and 46 respectively.

Figure 5:
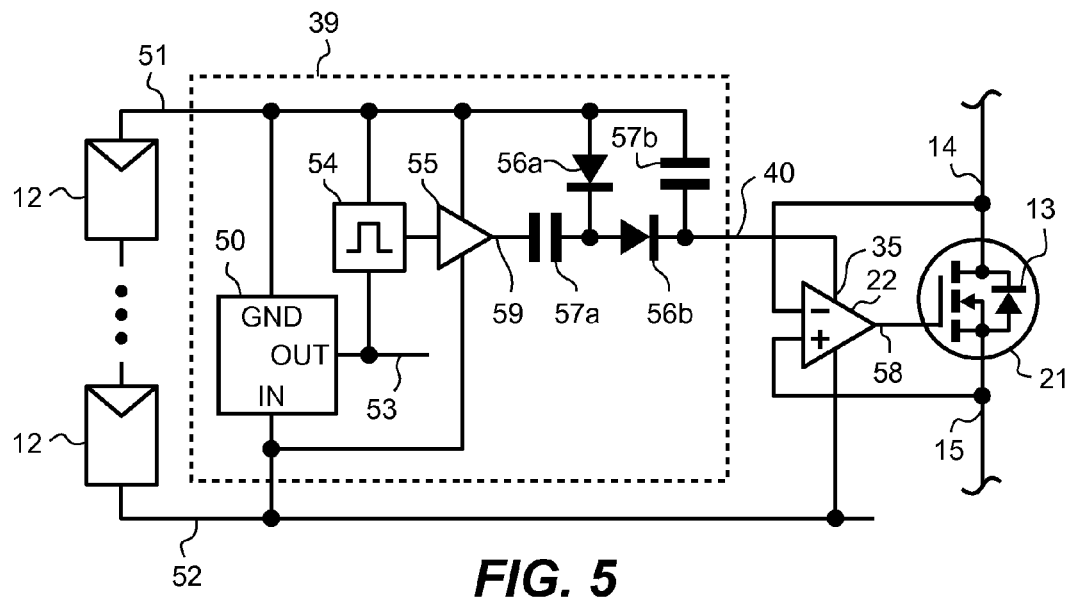
FIG. 5 is a simplified schematic showing one embodiment of the main power supply circuit.

FIG. 5 shows one embodiment of the main power supply 39 concluding two stages. The first stage 50 is a step-down power supply, which typically would be either a buck converter or a linear voltage regulator. The first stage 50 receives power from the PV segments 12 via a high supply rail 51 and a low supply rail 52, and produces a first supply voltage 53 which is typically −3.3V to −5V with respect to the top rail 51. The second stage is a voltage inverting charge pump comprising: an oscillator 54; a driver 55; two diodes 56a and 56b; and two capacitors 57a and 57b. The oscillator 54 typically produces a square wave of variable frequency from about 50 kHz to 300 kHz, and the output 59 of the driver swings from the bottom rail 52 to the top rail 51. When the driver output 59 is low, capacitor 57a charges via the first diode 56a. And when the driver output 59 is high, some of the charge in capacitor 57a is transferred to the output capacitor 57b via the second diode 56b, producing a voltage supply 40 that is higher than the top rail 51. By varying the pulse repetition frequency of the oscillator 54 the main supply output voltage 40 can be regulated at a level that is typically 10V to 15V higher than the top rail 51. Although it is easily possible to produce the main supply voltage 40 with just one stage—for example with a buck-boost converter—the two-stage topology offers two advantages: the first supply voltage 53 can be utilized to power other circuits, such as the main controller 41; and, the two-stage topology is easily incorporated into an integrated circuit without the need for many external components. For example, the first capacitor 57a may be only about 10 pF, and could be incorporated into a chip, while the second capacitor 57b is typically about 100 nF and would need to be external to the chip.

FIG. 5 also shows a power MOSFET used as the bypass switch 21, and the diode 13 is the integral body diode of the MOSFET. N-channel MOSFETs are typically used because they have relatively lower on-resistance compared to P-channels MOSFETs that are similarly priced.

Figure 6:
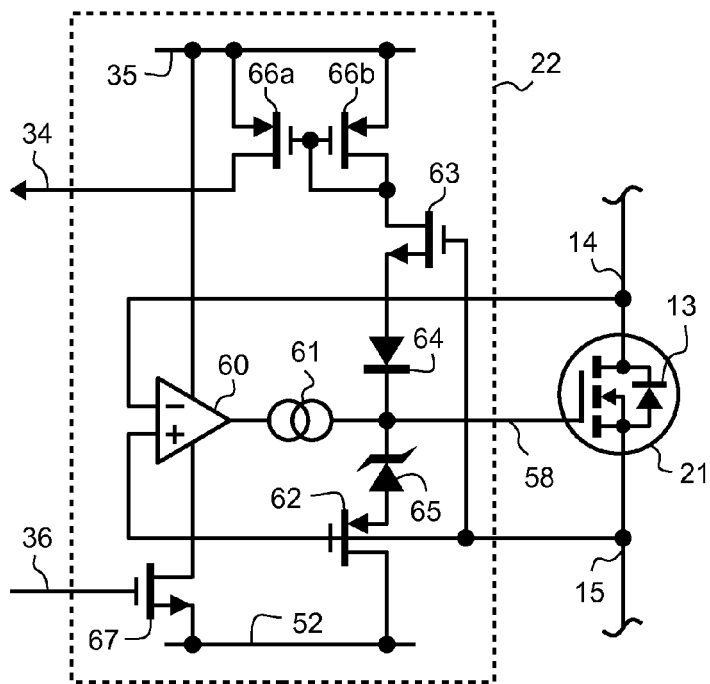
FIG. 6 is a simplified schematic diagram showing a first embodiment of the smart bypass circuit.

One aspect of the local controller 22 is that the voltage at its output 58 must not swing too high, or too low, with respect to the source pin of the power MOSFET 21, otherwise the MOSFET 21 may be damaged. For example, a typical power MOSFET has a maximum gate-to-source voltage rating of about 20V. Those of ordinary skill in the art will know that there are many ways to design the local controller 22 to satisfy this requirement. For example, FIG. 6 shows a simplified schematic of one embodiment of the local controller 22 wherein the output 58 voltage swing is limited by clamping. First, assume the disable input 36 is high (unasserted) with respect to the bottom rail 52, so that the transistor 67 is turned on, and the amplifier 60 is powered from the main supply voltage 35 and the bottom rail 52. The amplifier 60 has a very large voltage gain, typically greater than 1V/mV. The output voltage swing of the amplifier 60 is far too large to apply directly to the gate of the power MOSFET 21, so a clamping circuit is used, comprising: a bidirectional current limiter 61; two transistors 62 and 63; a diode 64; and a voltage regulator 65, such as a zener diode. When the output of the amplifier 60 swings high, current flows through the current limiter 61 into the voltage regulator 65 and then down to the bottom rail 52 via the bottom transistor 62. For example, if the voltage regulator 65 is a 7.5V zener diode, and the threshold voltage of the bottom transistor 62 is −2V, then the gate-to-source voltage applied to the power MOSFET 21 would be clamped at about 9.5V. When the output of the amplifier 60 swings low, current flows down from the main supply rail 35 via the current mirror 66a-66b, the top transistor 63, and the diode 64, and into the current limiter 61. For example, if the threshold voltage of 66b is −2V, and the threshold voltage of 63 is 2V, and the forward voltage drop through the diode 64 is 0.2V, then the gate-to-source voltage applied to the power MOSFET 21 would be clamped at about −4.2V.

The current mirror comprised of transistors 66a-66b communicates the on/off status of the bypass switch 21 to the main controller 41 via the output signal 34. When the bypass switch 21 is turned off, current flows through 66b and is mirrored in 66a; and when the bypass switch 21 is turned on, 66a and 66b are both cut off. Therefore, the status output 34 of each smart bypass circuit 30a-30c can be connected together, making an open-drain bus. This bus provides a means for the main controller 41 to determine when all the bypass switches 21 are closed concurrently. For example, if the current on the bus is above a predetermined threshold, that tells the main controller 41 that at least one bypass switch 21 is open. The predetermined threshold is set relatively higher than the worst case leakage current in the transistor 66a, multiplied by the number of smart bypass circuits 30.

In some embodiments the main power supply 36 must be capable of sourcing significant output current on the first supply rail 53, even though three smart bypass circuits 30a-30c and one main controller 38 typically require a total of less than 1 mA to operate. The extra supply current allows for the inclusion of other circuitry that can be useful in some applications. For example, a microcontroller and analog-to-digital converter can be added to the solar power module for the purpose of acquiring and analyzing data relating to the performance of the PV segments 12. Also, the communication interface 44 may require significant supply current. But large supply current can cause excessive heat dissipation if the step-down regulator 50 is a conventional linear regulator. For example, if the three PV segments 12a-12c each generates 15V, the total voltage into the step-down regulator 50 would be −45V. At just 20 mA load current on 53, power dissipation is 900 mW. One way to reduce the heat dissipation is to use a buck regulator instead of a conventional linear regulator, but this approach requires extra components that cannot be integrated onto a chip, such as an inductor.

Figure 7:
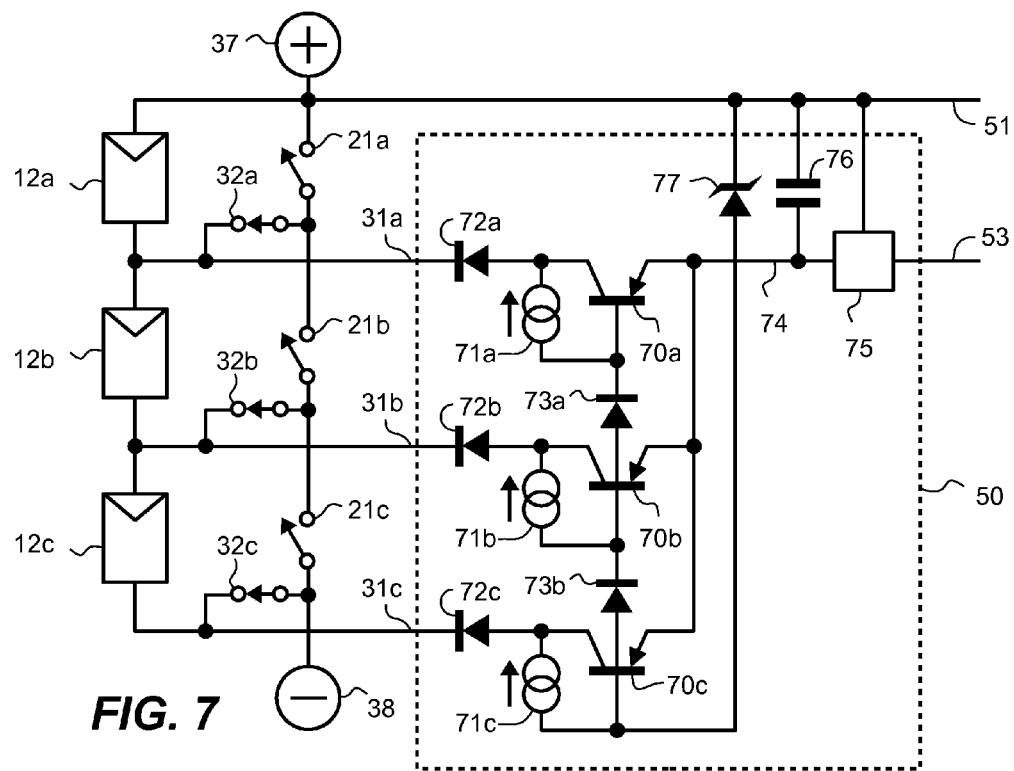
FIG. 7 is a simplified schematic diagram showing additional details of one embodiment of the main power supply circuit.

FIG. 7 shows a simplified schematic of one embodiment of the step-down voltage regulator 50 that significantly reduces the heat dissipation, without requiring an inductor. The circuit is an adaptive linear regulator that automatically selects one of the inputs 31a-31c to minimize power dissipation. The smallest input voltage that is large enough to produce the output will be selected. For example, assume a 6.4V zener diode 77 is chosen. If each PV segment 12a-12c is producing 12V, the top input 31a will be selected, and the top transistor 70a will carry all the load current. Bias current flows from the top rail 51 down through the zener diode 77, then up through the base diodes 73a-73b, then back to PV segment 12a via the first current reference 71a and the top collector diode 72a. With both base diodes 73a-73b forward biased, the bases of the bottom two transistors 70b-70c are at a higher voltage than the base of 70a, so transistors 70b-70c are cut off. But, if the top PV segment 12a is shaded, the associated bypass switch 21a will be closed, and the top input 31a will be essentially shorted to the top rail 51; in this case the top collector diode 72a is reverse biased, and the middle transistor 70b carries all the load current. If both 12a and 12b are shaded, then the bottom transistor 70c will carry all the load current. So the pre-regulator output 74 will be at about 6.4V±a diode drop in all cases, and a conventional linear post-regulator 75 produces a fixed −5V output 53 with respect to the top rail 51. If the max voltage produced by any PV segment is 15V, then the max power dissipation in the circuit—including the load—would be 300 mW at 20 mA; only a third of the heat dissipation in the example of the previous paragraph.

FIG. 8 discloses more details of the isolation switches 32. The isolation switches 32 are typically power MOSFETs with a voltage clamp 80, such as a zener diode, connected between the gate and the source.

FIG. 8 also shows a simplified schematic of the main controller 41. The top transistors 83a-83d form a current mirror controlled by a first current source 84, and the bottom transistors 85a-85d form a current mirror controlled by a second current source 86. A driver circuit 87 with complementary outputs 88a-88b controls the current sources 84 and 86. In response to the control input 42 signaling that all the bypass switches are closed concurrently, the driver circuit 87 closes all the isolation switches 32 by turning on the first current source 84 and turning off the second current source 86. As a result, approximately equal currents flow down from the main supply rail 40 to each of the outputs 43a-43c via transistors 83a-83c. The output current then flows through the zener clamp 80 to produce a gate-to-source voltage—typically about 10V—that turns on the MOSFET 32. In response to a reset signal 90 the driver circuit 87 opens all the isolation switches 32 by turning off the first current source 84 and turning on the second current source 86. As a result, approximately equal currents flow down through the zener clamps 80 to the bottom supply rail 52 via transistors 85a-85c, which makes the MOSFET 32 gate-to-source voltage approximately −0.6V and turns the MOSFET 32 off. To speed up the on/off transitions of the MOSFET 32, the current sources 84 and 86 may be relatively large—for example, 1 mA each—during the initial few microseconds. And then, to reduce power consumption the current would typically be reduced to only a few μA. In some embodiments, the reset signal 90 is produced by a timer circuit 89 which is triggered in response to the input 42 signaling that all the bypass switches are closed concurrently. In other embodiments, the reset signal 90 is produced by a microcontroller under firmware control.

FIG. 9 shows a timing diagram, illustrating how the solar power module operates. The middle three traces 91-93 represent the status outputs 34 of the three smart bypass circuits 30a-30c, and the bottom trace 94 represents the output 43 of the main controller 41 that controls the isolation switches. Initially, all the isolation switches 32 are closed, and all the bypass switches 21 are open. Then, as the various PV segments 12a-12c are shaded and unshaded, the associated bypass switches 21 close and open respectively.

If all the PV segments are shaded, then all the bypass switches 21 will be closed concurrently, as shown at time 95. Since the isolation switches 32 are also closed, all PV segments 12a-12c are short-circuited, and the input voltage to the main power supply 39 is nearly zero. In response to all bypass switches 21 being closed concurrently, the main controller 41 opens all the isolation switches 32. And when all the isolation switches open, the current in the PV segments is very low—typically only a few mA—so the input voltage to the main power supply 39 is essentially the sum of the open-circuit voltages of all the PV segments. Even though all the PV segments are still shaded, they can still produce enough voltage to power the main supply 39 because shading only blocks direct sunlight, not ambient light.

However, the main controller 41 cannot react instantaneously, so there is a brief delay ($t_1$)—typically a few microseconds—before the isolation switches 32 open; during this delay, the main power supply 39 continues to run off of stored energy, typically from one or more capacitors inside the main power supply 39, such as 76.

When all the isolation switches 32 are open, any current in the string ($I_{STRING}>0$) will forward bias all the diodes 13, so all the bypass switches 21 will remain closed. The only way out of this state is to close the isolation switches 32 again. This happens when the main controller 41 receives a reset 90 pulse after a delay ($t_2$), which is typically a few tens of milliseconds. If all the PV segments 12a-12c are still shaded when the isolation switches 32 are closed, as is the case at time 96, then the main controller 41 quickly opens the isolation switches 32 again. Now assume one of the PV modules, 12a for example, becomes unshaded immediately after time 96, and the short-circuit current in 12a exceeds the string current. The next reset pulse at time 97 closes the isolation switches again, but this time the bypass switch associated with 12a opens—after a short delay ($t_3$) as shown by trace 91—and consequently the main controller 41 keeps the isolation switches closed. The first PV segment 12a is then able to provide sufficient voltage to the main power supply 39, even though the other two PV segments 12b and 12c are short circuited.

FIG. 10 shows a high level diagram of the method 100 disclosed herein. In embodiments of the solar power module 29 which include the communication interface 44, the solar power module 29 is initially in a safe state 101, wherein all bypass switches 21 are closed and all isolation switches 32 are open. In embodiments which do not include the communications interface 44 the solar power module 29 goes directly to the operating state 102.

By entering the safe state 101 first, the solar power module protects installer personnel from potential shock hazards. When a start-up command is received via the communication interface 44, the solar power module 29 proceeds to the operating state 102. Additionally, the solar power module may be shut down at any time with a shut-down command received via the communication interface 44. For example, during a fire the solar power module can be put into the safe state 101 to protect firefighters from shock hazard.

The main controller 41 sets the bypass circuits 30 to the safe state by asserting the disable inputs 36—thus forcing all the bypass switches 21 to close, and consequently making all the isolation switches 32 open—and also inhibits the reset signal 90, thereby keeping the solar power module in the safe state until the start-up command is received.

In the operating state 102, steps 105 and 106 are performed independently by each smart bypass circuit 30. Step 105 closes the bypass switch 21 in response to the associated diode 13 being forward biased, thereby protecting the diodes from over heating. Step 106 opens the bypass switch 12 is in response to the associated diode 13 being reverse biased.

Also in the operating state 102, steps 107 and 108 provide uninterrupted power to all the local control circuits 22. In step 107, all the isolation switches 32 remain closed as long as at least one bypass switch 21 is open; but when all bypass switches 21 are closed concurrently, step 108 opens all the isolation switches 32. Therefore, there is always at least one PV segment 12 providing voltage to power the local control circuits 22. After a delay, the reset signal 90 returns the system to step 107. If the shade has been removed from any PV segment during this delay period, then the associated bypass switch 21 will open and the isolation switches 32 will remain closed. However, if all the PV segments 12 are still shaded, then the system quickly returns to step 108 wherein the isolation switches 32 open.

Although several embodiments have been described in detail for purposes of illustration, various modifications may be made to each without departing from the scope and spirit of the invention. Accordingly, the invention is not to be limited, except as by the appended claims.

What is claimed is:

1. A solar power module, comprising:
   a pair of power output terminals;
   a plurality of bypass circuits serially connected between the two power output terminals, each bypass circuit comprising:
   a first terminal and a second terminal for said serial connection between the two power output terminals,
   a diode disposed between the first and second terminals,
   a first switch connected in parallel with the diode,
   a local controller for determining the polarity of the voltage across the diode and controlling the first switch, and
   a second switch disposed between the second terminal and a third terminal;
   a main controller for controlling the second switch in each bypass circuit and determining when all the first switches are closed concurrently;
   a plurality of photovoltaic segments for converting light into electricity, each photovoltaic segment having a plurality of photovoltaic cells connected in series, the photovoltaic segments serially coupled to at least one of the power output terminals and the third terminal in each bypass circuit; and
   a main power supply for receiving power from at least one of the photovoltaic segments and providing power to at least the bypass circuits.

2. The solar power module of claim 1, wherein each local controller is adapted to close the first switch in response to the voltage at the anode of the diode being relatively higher than the voltage at the cathode of the diode, and open the first switch in response the voltage at the anode of the diode being relatively lower than the voltage at the cathode of the diode.

3. The solar power module of claim 2, wherein the main controller is adapted to open the second switch in each bypass circuit in response to all the first switches being closed concurrently, and then close the second switch in each bypass circuit in response to a reset signal.

4. The solar power module of claim 3, wherein the main controller includes a timer that is triggered in response to all the first switches being closed concurrently, and in response to being triggered the timer produces the reset signal after a predetermined delay.

5. The solar power module of claim 4, including a communication interface for at least receiving a shut-down command and a start-up command.

6. The solar power module of claim 5, wherein the communication interface comprises a device selected from the group consisting of: a wireless receiver; a wireless transceiver; a power-line modem; a isolation transformer; and an optocoupler.

7. The solar power module of claim 5, wherein each local controller is adapted to close the first switch in response to the shut-down command.

8. The solar power module of claim 5, wherein the main controller is adapted to inhibit the reset signal in response to the shut-down command.

9. The solar power module of claim 5, wherein the main controller is adapted to enable the reset signal in response to the start-up command.

10. The solar power module of claim 1 wherein the first switch in at least one bypass circuit comprises a power MOSFET, and the associated diode comprises the integral body diode of the power MOSFET.

11. The solar power module of claim 1, wherein the main power supply includes a means for selecting one power input from a group of power inputs comprising the third terminal in each bypass circuit to power at least the local controllers.

12. A method for protecting bypass diodes in a solar power module from overheating, wherein the solar power module includes a plurality of bypass diodes serially connected between two power output terminals, each bypass diode having a bypass switch connected in parallel with it and an isolation switch coupling the bypass diode to an associated segment of photovoltaic cells, the method comprising steps of:
   closing a bypass switch in response to the associated bypass diode being forward biased;
   opening a bypass switch in response to the associated bypass diode being reverse biased;
   disconnecting the photovoltaic segments by opening all the isolation switches in response to all the bypass switches being closed concurrently; and
   reconnecting the photovoltaic segments by closing all the isolation switches in response to a reset signal.

13. The method of claim 12, wherein circuitry that controls the bypass switches and the isolation switches are powered with voltage produced by at least one of the photovoltaic segments.

14. The method of claim 12, wherein the reset signal is produced in response to all the bypass switches being closed concurrently, after a predetermined delay.

15. The method of claim 12, wherein the solar power module includes a communication interface for at least receiving a start-up command and a shut-down command.

16. The method of claim 15, wherein all the bypass switches are closed in response to the shut-down command.

17. The method of claim 15, wherein the reset signal is inhibited in response to the shut-down command.

18. The method of claim 15, wherein the reset signal is enabled in response to the start-up command.

* * * * *